US011114219B2

(12) United States Patent
Albukrek

(10) Patent No.: US 11,114,219 B2
(45) Date of Patent: Sep. 7, 2021

(54) STRAND LEADTHROUGH DEVICE

(71) Applicant: Bimed Teknik Aletler Sanayi ve Ticaret A.S., Buyukcekmece Istanbul (TR)

(72) Inventor: Yilmaz Albukrek, Istanbul (TR)

(73) Assignee: BIMED TEKNIK ALETLER SANAYI VE TICARET A.S., Istanbul (TR)

( * ) Notice: Subject to any disclaimer, the term of this patent is extended or adjusted under 35 U.S.C. 154(b) by 0 days.

(21) Appl. No.: 17/044,363

(22) PCT Filed: Apr. 15, 2019

(86) PCT No.: PCT/EP2019/059653
§ 371 (c)(1),
(2) Date: Oct. 1, 2020

(87) PCT Pub. No.: WO2019/201850
PCT Pub. Date: Oct. 24, 2019

(65) Prior Publication Data
US 2021/0151224 A1      May 20, 2021

(30) Foreign Application Priority Data

Apr. 19, 2018 (DE) ..................... 10 2018 109 331.4

(51) Int. Cl.
*H02G 3/22* (2006.01)
*H01B 17/30* (2006.01)
*H05K 9/00* (2006.01)

(52) U.S. Cl.
CPC ............. *H01B 17/303* (2013.01); *H02G 3/22* (2013.01); *H05K 9/0018* (2013.01)

(58) Field of Classification Search
CPC .. H02G 3/22; H02G 3/24; H02G 3/26; H02G 3/30; H02G 3/36; H02G 3/083;
(Continued)

(56) References Cited

U.S. PATENT DOCUMENTS 3,489,440 A * 1/1970 Brattberg Nils Arthur Johan .......
F16B 2/065
248/56
4,677,253 A * 6/1987 Blomqvist ............... H02G 3/22
174/362

(Continued)

FOREIGN PATENT DOCUMENTS

AT           511423 B1       5/2015
DE        19731448 C2        2/1998
(Continued)

*Primary Examiner* — Angel R Estrada
(74) *Attorney, Agent, or Firm* — Leydig, Voit & Mayer, Ltd.

(57) ABSTRACT

A strand leadthrough device for leading a plurality of strands in the form of cables or cable bundles, pipes, and/or tubes through a passage in a wall includes: a frame which is fastenable to an outer side of the wall and encloses at least one clearance through which the strands are led; a first sealing membrane which has a plurality of leadthrough openings through which a strand is led; and a second sealing membrane having a plurality of leadthrough points through which a strand is led. In order to form a leadthrough channel for a strand, in each case one leadthrough point of the second sealing membrane is assigned in each case to one leadthrough opening in the first sealing membrane. In a region of the leadthrough points, the second sealing membrane has elastically deformable sealing lamellae which, in a starting state, lie against one another closing the leadthrough channel.

20 Claims, 10 Drawing Sheets

(58) Field of Classification Search
CPC .......... H02G 15/007; H02G 3/28; H02G 3/08; H02G 3/081; H02G 3/085; H02G 15/013; H02G 3/12; H02G 3/18; H02G 3/10; H02G 3/121; B60R 16/0222; B60R 16/0215; H01B 17/303; H01B 17/30; H01B 17/301; H05K 9/0018
USPC ........ 174/650, 351, 151, 135, 152 G, 153 G, 174/152 R, 659, 664, 137, 155, 156, 174/137 R; 248/74.1, 74.2, 74.3, 68.1, 248/65, 49, 56; 16/2.1, 2.2
See application file for complete search history.

(56) References Cited

U.S. PATENT DOCUMENTS

| | | | |
|---|---|---|---|
| 7,288,730 B2 * | 10/2007 | Habel | H02G 3/22 16/2.1 |
| 7,371,969 B2 * | 5/2008 | Hedstrom | H02G 3/22 174/151 |
| 8,598,472 B2 * | 12/2013 | Hildingsson | H02G 3/22 174/657 |
| 8,616,506 B2 * | 12/2013 | Milton | H02B 1/305 248/74.1 |
| 8,814,596 B2 * | 8/2014 | Millevik | F16L 5/14 174/78 |
| 8,963,010 B2 * | 2/2015 | Sprenger | H02G 3/22 174/151 |
| 9,249,902 B2 * | 2/2016 | Munroe | H01R 13/5205 |
| 9,350,152 B2 * | 5/2016 | Andresen | H01R 43/20 |
| 2014/0262479 A1 | 9/2014 | Abalian | |

FOREIGN PATENT DOCUMENTS

| | | |
|---|---|---|
| DE | 102013012596 A1 | 2/2015 |
| EP | 2030653 A1 | 3/2009 |
| EP | 2139086 A1 | 12/2009 |
| WO | WO 8905533 A1 | 6/1989 |
| WO | WO 2018127428 A1 | 7/2018 |

* cited by examiner

STRAND LEADTHROUGH DEVICE

CROSS-REFERENCE TO PRIOR APPLICATIONS

This application is a U.S. National Phase application under 35 U.S.C. § 371 of International Application No. PCT/EP2019/059653, filed on Apr. 15, 2019, and claims benefit to German Patent Application No. DE 10 2018 109 331.4, filed on Apr. 19, 2018. The International Application was published in German on Oct. 24, 2019 as WO 2019/201850 under PCT Article 21(2).

FIELD

The invention relates to a strand leadthrough device for leading a plurality of strands in the form of cables or cable bundles, pipes and/or tubes through a passage in a wall, having a frame which is fastenable to an outer side of the wall and encloses at least one clearance through which the strands are led, having a first sealing membrane which has a plurality of leadthrough openings through which a strand is led, and having a second sealing membrane.

BACKGROUND

DE 10 2013 012 596 A1 discloses a strand leadthrough device in which a second sealing membrane is provided, the purpose of which consists in sealing leadthrough openings of a first sealing membrane that are not occupied by a strand. The second sealing membrane is pierced for a strand to be led therethrough, i.e. is irreversibly destroyed in regions, as a result of which a change in the configuration, for example in respect of a lower number and/or smaller diameters of the strands to be led through is not possible.

DE 197 31 448 A1 discloses a fastening device for round cables in walls, with an elastic plate which has pre-punched holes through which a round cable is led. US 2014/0262479 A1 discloses a holding strip for holding a cable. EP 2 030 653 A1 discloses a cable leadthrough device with a fire protection plate.

SUMMARY

In an embodiment, the present invention provides a strand leadthrough device for leading a plurality of strands in the form of cables or cable bundles, pipes, and/or tubes through a passage in a wall, comprising: a frame which is fastenable to an outer side of the wall and encloses at least one clearance through which the strands are led; a first sealing membrane which has a plurality of leadthrough openings through which a strand is led; and a second sealing membrane having a plurality of leadthrough points through which a strand is led, wherein, in order to form a leadthrough channel for a strand, in each case one leadthrough point of the second sealing membrane is assigned in each case to one leadthrough opening in the first sealing membrane, and wherein, in a region of the leadthrough points, the second sealing membrane has elastically deformable sealing lamellae which, in a starting state, lie against one another closing the leadthrough channel and, in a deformed use state, lie against a strand which is led through the leadthrough channel.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 6b shows a side view of the frame according to FIG. 6a;

FIG. 10b shows a sectional illustration of the region of a leadthrough point of the second sealing membrane according to FIG. 10a along the section plane Xb-Xb shown in FIG. 10a;

FIG. 11b shows a side view of the stabilizing frame according to FIG. 11a;

DETAILED DESCRIPTION

Figure 1:
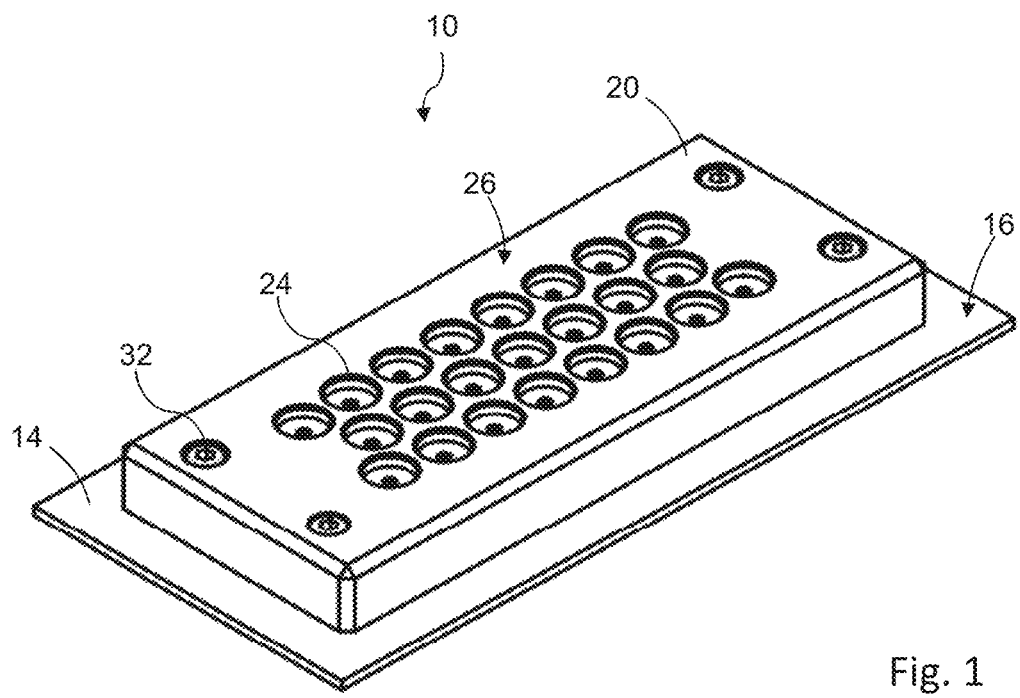
FIG. 1 shows a perspective illustration of an embodiment of a strand leadthrough device from a perspective directed toward an outer side of a wall.

In an embodiment, the present invention provides a strand leadthrough device which achieves a high sealing action and tension relief and is usable flexibly. Furthermore, simple installation is desirable.

In an embodiment, the present invention provides a strand leadthrough device of the type mentioned at the beginning in that the second sealing membrane has a plurality of leadthrough points through which a strand is led, wherein, in order to form a leadthrough channel for a strand, in each case one leadthrough point of the second sealing membrane is assigned in each case to one leadthrough opening in the first sealing membrane, and wherein, in the region of the leadthrough points, the second sealing membrane has elastically deformable sealing lamellae which, in a starting state, lie against one another closing the leadthrough channel and, in a deformed use state, lie against a strand which is led through the leadthrough channel.

In an undeformed starting state, the sealing lamellae of the second sealing membrane lie in a sealing manner against one another and close the respective leadthrough point. A leadthrough channel formed by in each case one leadthrough point of the second sealing membrane and one leadthrough opening of the first sealing membrane is accordingly likewise closed. It is thereby ensured that a high sealing action (high IP protection class) of the strand leadthrough device is ensured even without strands led therethrough.

During the leading through of a strand, the sealing lamellae are deflected corresponding to the leadthrough direction such that the strand can be led in a simple manner through the leadthrough point without further installation steps being required. Rapid and therefore cost-effective installation of the strands can thereby be achieved. In this use state (i.e. when a strand has been led through), the sealing lamellae, because of their elastic restoring force, lie in a sealing manner against the strand. A sealing action (IP protection class) is thus achieved even when a strand has been led through.

When the strand is pulled back counter to the leadthrough direction, the sealing lamellae, because of the static friction acting between sealing lamellae and strand, are moved in the direction of their starting state (i.e. into the plane spanned by the second sealing membrane). Since—in contrast to an undeformed starting state without a strand—the strand which has been led through takes up a certain volume in the region of the leadthrough points, the sealing lamellae, as the strand is being pulled back, are elastically deformed in the radial direction and thus exert a compressive force on the strand. The resulting static friction between the sealing lamellae and the strand brings about particularly high tension relief of the strand.

After removal of the strand (for example by completely pulling the latter back counter to the leadthrough direction or by complete "pulling through of the strand in the leadthrough direction), the sealing lamellae, because of their elastic restoring force, lie against one another again in a sealing manner, and therefore the starting state closing the leadthrough channel is reached. The strand leadthrough device is thus reclosable without additional components, such as, for example, stoppers, being required.

This has the advantage that a possible erroneous installation of a strand can be corrected in a simple manner without the sealing action of the strand leadthrough device being impaired. A wrongly laid strand can simply be removed again and reinstalled in the correct position. The recloseability furthermore makes it possible for a strand leadthrough device which has already been fitted to continue to be used even if a change in the strand arrangement is required (for example additional strands, new arrangement of the strands). By this means, the outlay on installation and therefore the installation costs can be reduced.

Within the context of the invention, a membrane is understood as meaning a flat material layer which preferably extends parallel to a plane spanned by the frame and in particular has a relatively small thickness of, for example, a maximum of 5 mm, in comparison to the flat extent of the membrane.

In a preferred embodiment, the sealing lamellae are bounded by slots in the second sealing membrane, wherein preferably the slots, which are assigned to a respective leadthrough point, run radially outward from the center point of the respective leadthrough point. The sealing lamellae are thus formed integrally with the second sealing membrane and are separated from one another merely by means of slots. This permits a particularly simple production of the sealing lamellae. Furthermore, boundary surfaces, which are defined by the slots, are formed between adjacent sealing lamellae, as a result of which a sealing lying of the sealing lamellae on one another in the starting state is promoted and thus a good sealing action (high IP protection class) is obtained.

By the slots running radially outward from the center point of the leadthrough point, substantially triangular sealing lamellae are formed which, in a region spaced apart from the center point, merge into the material of the second sealing membrane, the material surrounding a leadthrough point, and from there taper in the direction of the center point of the leadthrough point. When a strand is led through, the lamellae expand from the center point of the leadthrough point. The leadthrough point is thus opened from its center point and opens up a leadthrough passage. The leadthrough point here is opened only to the extent required for the thickness of a strand to be led through, and therefore undeformed, radially outer edge regions of the sealing lamellae preferably continue to lie in a sealing manner against one another. This has the advantage that strands of differing diameter can be led through, sealed and relieved of tension in a simple manner without the leadthrough points having to be coordinated with the respective strand diameter. The strand leadthrough device can thereby be used in a variable manner and does not have to be adapted to a specific strand arrangement.

Furthermore, it is preferred if the sealing lamellae are identical in size and/or are arranged distributed regularly, as seen in the circumferential direction. By this means, uniform sealing and tension relief over and beyond the circumference of the strand is ensured. A symmetrical arrangement of the sealing lamellae furthermore achieves a uniform distribution of tension in the second sealing layer, which promotes the recloseability. There are preferably three sealing lamellae of identical size, in particular four sealing lamellae of identical size, per leadthrough point.

In a further preferred embodiment, the second sealing membrane is produced from an elastomer, preferably from a polyurethane gel. Such materials are firstly distinguished by high elasticity. This promotes the deformation of the sealing lamellae such that even thick strands can be led through in a simple manner.

Furthermore, such materials, in particular polyurethane gels, are distinguished by a high restoring force, thus improving the recloseability of the leadthrough points of the second sealing membrane. After a strand is removed, the restoring force ensures that the sealing lamellae are moved back again into their starting state and lie against one another there with mutually facing lateral wall portions of adjacent sealing lamellae—closing the leadthrough point.

Furthermore, such materials, in particular polyurethane gels, are distinguished by high adhesion. By this means, firstly, the sealing action between the sealing lamellae in their starting state is improved. Furthermore, a particularly high tension relief of the strand is obtained by the adhesion between the sealing lamellae and a strand.

A material of this type may be, for example, a polyurethane gel.

The second sealing membrane preferably has a minimum thickness of 2 mm and/or a maximum thickness of 5 mm. A minimum thickness is advantageous for the stability of the second sealing membrane. Furthermore, the minimum thickness mentioned is advantageous in order, in the starting state of the sealing lamellae, to provide an adhesive action between the sealing lamellae and thus to obtain a high sealing action (high IP protection class).

Conversely, an increase in the thickness of the second sealing membrane leads to more material having to be deformed when a strand is led through. This increases the resistance when introducing and leading a strand through, and a greater distance between adjacent leadthrough points may have to be maintained in order to keep sufficient space for the deformed material. On the other hand, comparatively thick sealing lamellae have the advantage of being able to permit a particularly high sealing and tension relief action.

In a further preferred embodiment, the first sealing membrane is produced from a rubberized fabric. Such a material is distinguished by high elasticity (caused by the rubber) with simultaneous stability (caused by the fabric). This ensures that strands of differing diameters can be reliably sealed and a high IP protection class can be achieved.

When a strand is led through a leadthrough opening in the first sealing membrane, the leadthrough opening is expanded elastically, with the edge of the leadthrough opening lying in a sealing manner around the strand. The high elasticity of the material makes it possible for strands of differing diameter, in particular with a larger diameter than the diameter of the leadthrough opening, being able to be led through and being reliably sealed by the first sealing membrane. The fabric ensures that, even when thick strands are led through, no cracking occurs in the first sealing membrane in the region of the leadthrough openings, which would impair a sealing action.

A rubberized fabric of this type may be, for example, a material which is used for producing commercially available air mattresses.

In a further preferred embodiment, the first sealing membrane is connected in an integrally bonded manner to the frame, preferably by means of an adhesive connection. It is preferred here if the first sealing membrane is connected to a rear side of the frame, the rear side facing the outer side of the wall. Particularly preferably, the first sealing membrane has a thin adhesive layer on a side facing the rear side of the frame—in regions between the leadthrough openings.

The integrally bonded connection of the first sealing membrane to the frame limits a deformation of the first sealing membrane, when a strand is led therethrough, to the region of the respective leadthrough opening. Thus, when a strand is led through, the sealing of adjacent strands is only slightly affected, if at all. Furthermore, in particular also shearing forces can be transmitted between frame and first sealing membrane by the integrally bonded connection. This makes it possible to ensure that the first sealing membrane does not slip relative to the frame. It is thus ensured that the leadthrough openings of the first sealing membrane are not covered by the frame; i.e. they always remain accessible via the at least one clearance of the frame. This is advantageous in particular in a configuration of the strand leadthrough device, in which the frame has a number of clearances corresponding to the number of leadthrough openings of the first sealing membrane.

Furthermore, it is preferred if the center points of the leadthrough openings of the first sealing membrane, which leadthrough openings are in each case assigned to one another in order to form a leadthrough channel for a strand, and the center points of the leadthrough points of the second sealing membrane are arranged on an imaginary axis oriented perpendicular to the outer side of the wall. This permits a particularly simple and intuitive installation of the strands.

In a further preferred embodiment, a stabilizing layer is provided which is arranged between first sealing membrane and second sealing membrane and which has a plurality of passage openings, preferably corresponding to the number of leadthrough openings of the first sealing membrane, through which a strand is led. The stabilizing layer serves firstly as a spacer between first and second sealing membrane. It is thereby ensured that the functions of the two membranes do not impair one another. For example, space between the membranes is maintained by the stabilizing layer, and therefore an edge of the first sealing membrane that has been opened out by a strand having been led therethrough is not pressed into the leadthrough point of the second sealing membrane.

Furthermore, the stabilizing layer serves for lateral sealing between first and second sealing membrane, and therefore a high IP protection class is achieved. Moreover, the stabilizing layer has the task of assisting deformations of the first and second sealing membrane which surround it. The stabilizing layer preferably has greater rigidity than the first sealing membrane and/or the second sealing membrane. The stabilizing layer is preferably at least partially produced from a silicone, in particular a (hard) silicone.

In a further preferred embodiment, a stabilizing frame is provided which is arranged on that side of the second sealing membrane which faces away from the stabilizing layer, and which has a plurality of frame openings, preferably corresponding to the number of leadthrough openings of the first sealing membrane. The stabilizing frame is preferably manufactured from a thermoplastic material, in particular a polyamide. The stabilizing frame serves for further stabilization of the first and second sealing membrane. In particular, the stabilizing frame has the effect that a deformation of the second sealing membrane as a strand is being led therethrough is limited to the region of the respective leadthrough point. By this means, when a strand is led through, the sealing of adjacent strands is only slightly affected, if at all.

Furthermore, it is preferred if the diameter of the frame openings of the stabilizing frame is equal to 0.8 to 1.2 times, in particular to 0.9 to 1.1 times the sum of maximum diameter of a strand to be led through and twice the thickness of the second sealing membrane. The effect achieved by this is that the sealing lamellae have sufficient space in order to be deformed when a strand is led through, and not to be blocked by the edges of the frame openings. This promotes particularly easy leading through of a strand and thus rapid installation.

Furthermore, it is preferred if the stabilizing frame has latching portions for latching contact against an inner side of the wall. This permits simple, rapid and therefore cost-effective installation of the strand leadthrough device on a wall. For the fastening to a wall, the strand leadthrough device merely has to be inserted in a latching manner into the passage in the wall without further fastening means (for example screws) and/or tool (for example screwdriver) being required.

In a further preferred embodiment, at least one fire protection layer which is preferably manufactured from an intumescent material is provided. This ensures that, even in the region of a passage, the fire protection requirements imposed on a wall, for example in respect of smoke permeability and/or fire resistance, are met. This is of great importance in particular in the case of passages in fire protection walls. The use of an intumescent material which swells upon action of heat ensures reliable sealing of the passage even in the event of a fire.

In a further preferred embodiment, a shielding apparatus is provided which serves for ensuring the electromagnetic compatibility. Particularly preferably, the shielding apparatus is produced from an electrically conductive elastomer material. Such a material has the advantage that a flatly distributed electrical contact can be produced in a simple manner. This is of advantage in particular for the contact connection of a cable shield which has a multiplicity of braids and therefore an overall uneven contact surface.

Electrically conductive elastomer materials of this type can be produced, for example, by mixing an elastomer with electrically conductable fillers. The fillers can be, for example, carbon particles, in particular soot, and/or metal particles.

The shielding apparatus preferably comprises a first contact plate, a second contact plate and a contact layer arranged between first and second contact plate, wherein the contact layer has a plurality of leadthrough regions, preferably corresponding to the number of leadthrough openings of the first sealing membrane, through which a strand is led, and wherein, in the region of the leadthrough regions, the contact layer has elastically deformable compact lamellae.

When a cable is led through, the contact lamellae of the contact layer are placed, forming an electrical contact, against the cable or against the shield of a cable, which is freed from the insulation at least in a partial region. The formation as contact lamellae makes it possible for even cable shields of differing thickness to be able to be electrically contacted reliably without the leadthrough regions having to be adapted to different cable diameters. In addition, a tension relief and sealing action is achieved.

The contact layer is electrically connected to the two contact plates which, for their part, are in electrical contact with the surroundings of the strand leadthrough device, i.e., for example, with the wall, through the passage in which cable strands are to be guided. The contact plates are manufactured, for example, from a metal sheet.

The contact layer can be the second sealing membrane. However, it is preferred if the contact layer is an additional layer.

Irrespective of the embodiments mentioned above, it is possible for the frame to have pins which protrude from a rear side facing the outer side of the wall and which can be inserted in a clamping manner into corresponding receiving holes in certain abovementioned components. The components are, for example, the first sealing membrane and/or the second sealing membrane and/or the stabilizing layer and/or the stabilizing frame and/or the fire protection layer and/or the first contact plate and/or the contact layer and/or the second contact plate. The pins are a particularly simple structural means for fastening the components to the frame. The pins are preferably formed integrally with the frame, for example by production of the frame and the pins in an injection molding method.

Furthermore, the frame, on an edge surface intended for contact against the outer side of the wall, can have a sealing apparatus for sealing the frame against the outer side of the wall. This ensures a high IP protection class. It is conceivable, for example, for an O ring encircling the circumference of the frame to be provided. Housing unevennesses can thus also be compensated for in a simple manner.

It is also advantageous if the frame has screw bores for receiving fastening screws. A screw connection is a particularly simple means for fastening the frame to a wall. Moreover, a screw connection permits variable insertability of the strand leadthrough device on walls of differing structure. For example, screw types suitable for different types of wall can be selected in order always to ensure reliable fastening of the frame to a certain type of wall.

Further features and advantages of the invention are the subject matter of the description below and of the graphical illustration of a preferred exemplary embodiment.

FIG. 1 illustrates an embodiment of a strand leadthrough device that is denoted overall by the reference sign 10. The strand leadthrough device 10 serves for leading a plurality of strands in the form of cables or cable bundles, pipes and/or tubes through a passage 12 in a wall 14. An individual strand 11 is illustrated by way of example in FIGS. 10b to 10e. The passage 12 can be, for example, an opening in a housing wall of an electrical switch cabinet or of an electrical appliance.

Figure 2:
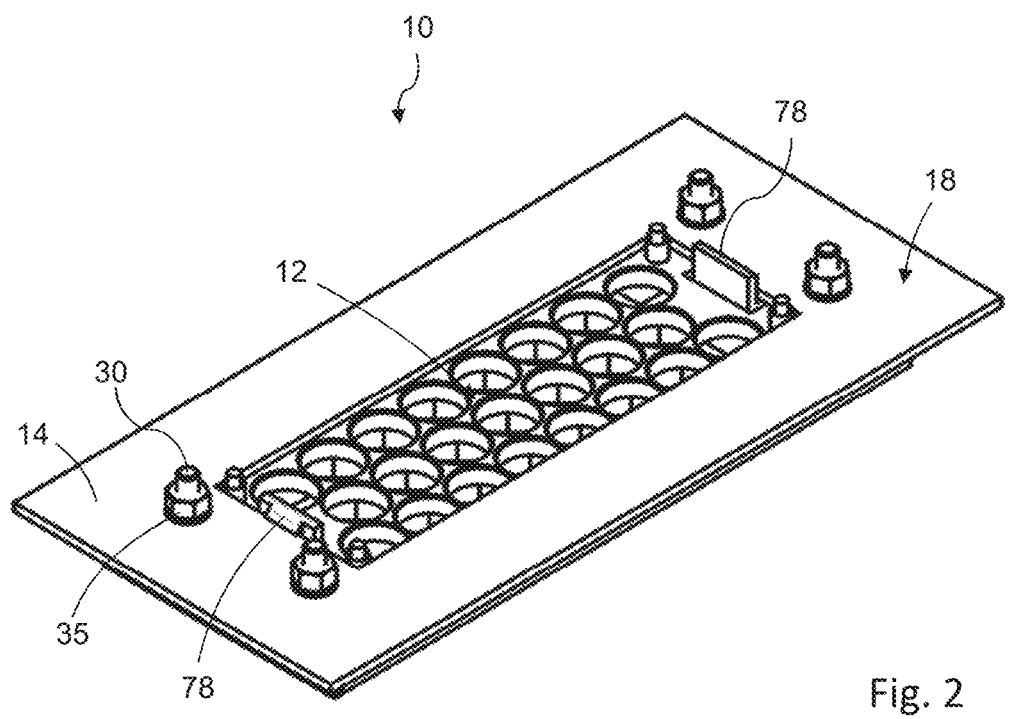
FIG. 2 shows a perspective illustration of the strand leadthrough device according to FIG. 1 from a perspective directed toward an inner side of a wall.

The wall 14 has an outer side 16 (for example facing the surroundings of a switch cabinet) and an inner side 18 (for example facing the interior of a switch cabinet), also compare FIG. 1 and FIG. 2. Within the meaning of the present invention, the outer side 16 means that side of the wall 14 from which the strand leadthrough device 10 is mounted on the wall 14.

Figure 5:
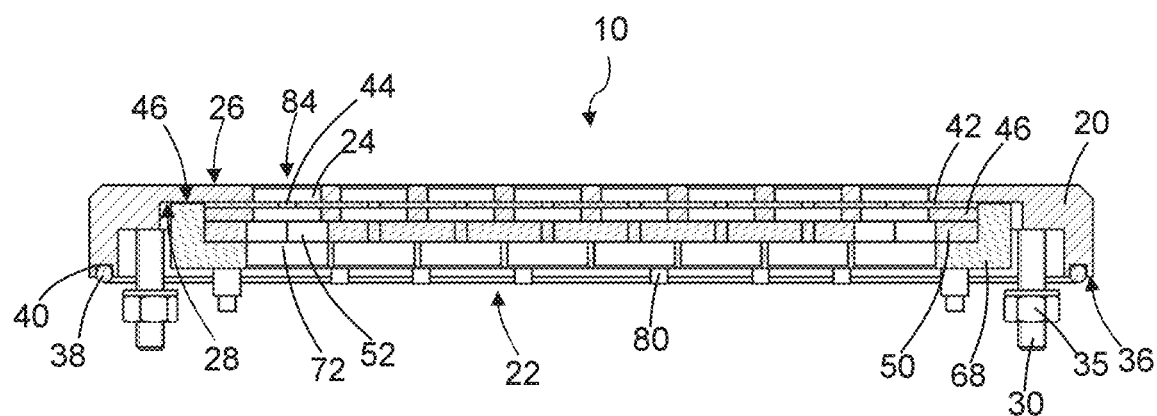
FIG. 5 shows a sectional illustration of the strand leadthrough device according to FIG. 4 along the section plane V-V shown in FIG. 4.
Figure 6A:
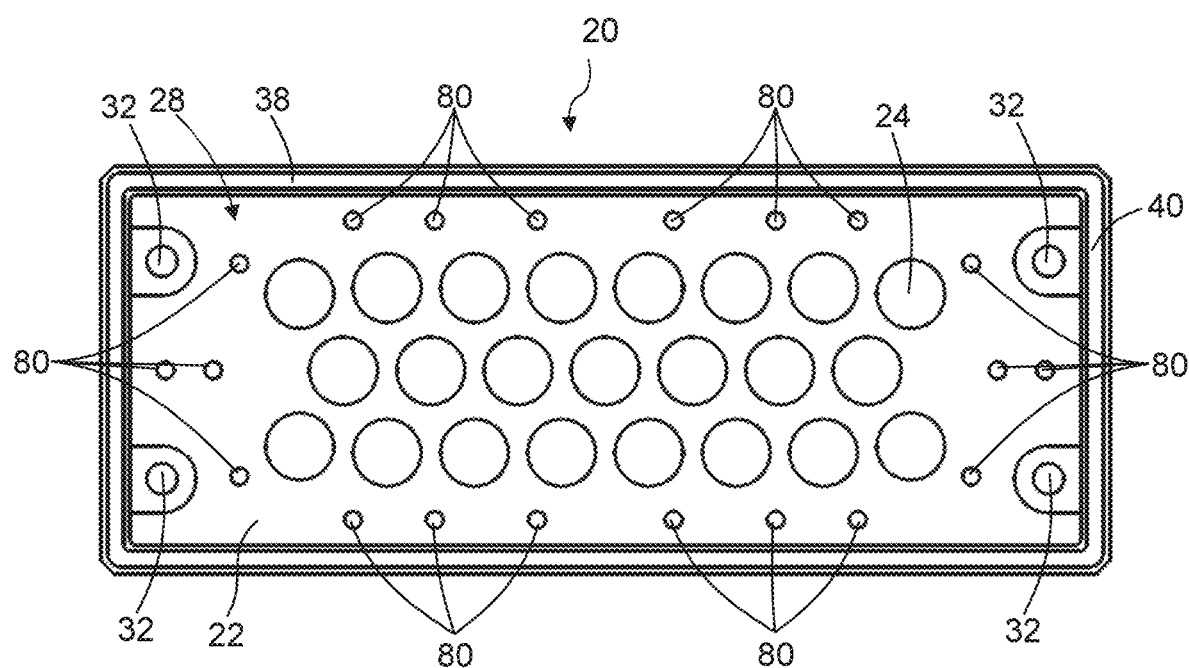
FIG. 6a shows a bottom view of a frame of the strand leadthrough device according to FIG. 1.
Figure 6B:
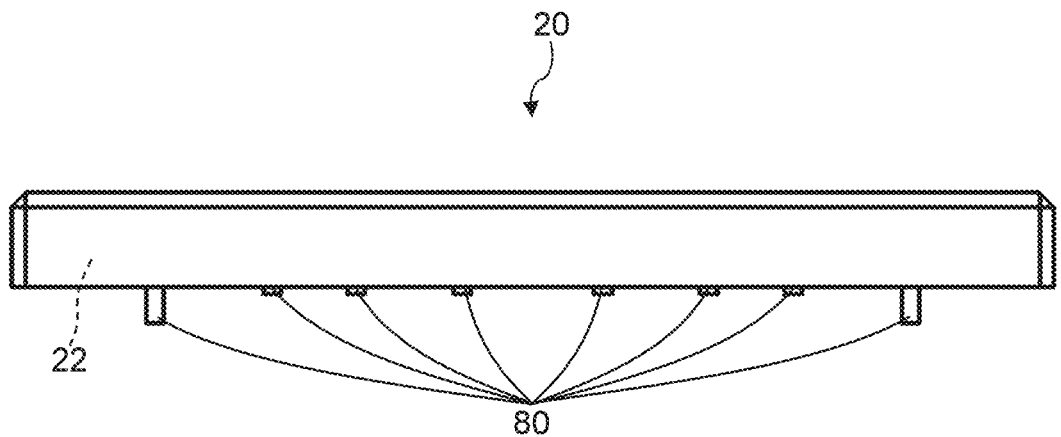

The strand leadthrough device 10 has a frame 20 for fastening to the outer side 16 of the wall 14 (compare FIGS. 6a and 6b). The frame 20 is in the form of a, for example, cuboidal hollow body which is open on one side. The frame 20 bounds an interior 22 (compare FIG. 5) which, in a mounted state of the frame 20, faces the passage 12 in the wall 14.

Figure 10A:
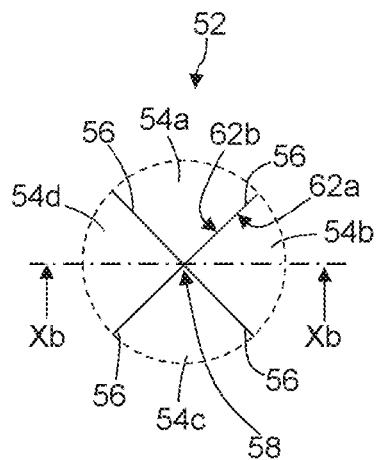
FIG. 10a shows an enlarged detail of a region of a leadthrough point of the second sealing membrane according to FIG. 9, in a closed starting state of the leadthrough point.
Figure 10B:
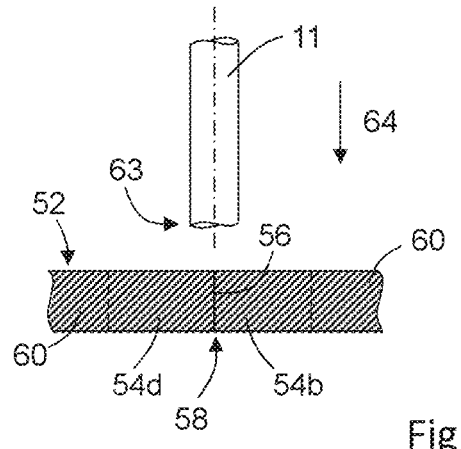

The frame 20 has a plurality of clearances 24, for example in the form of circular bores, which each serve for the leading through of a strand 11 (compare FIGS. 6a and 10b). The clearances 24 extend from a front side 26 of the frame 20, the front side facing away from the interior 22, as far as a rear side 28 of the frame 20, the rear side facing the interior 22 (compare FIG. 5). In a mounted state of the frame 20, the front side 26 of the frame faces away from the outer side 16 of the wall 14 and the rear side 28 of the frame 20 faces the outer side 16 of the wall 14.

The frame 20 can be fastened to the wall 14 by means of fastening screws 30. For this purpose, the frame 20 has a plurality of screw bores 32 (for example four screw bores 32 arranged in the corner regions of the frame 20) for receiving the fastening screws 30. In a mounted state of the frame 20, the fastening screws 30 engage in corresponding screw receptacles 34 in the wall 14 and are screwed there with corresponding nuts 35 (compare FIG. 2 and FIG. 3).

Figure 3:
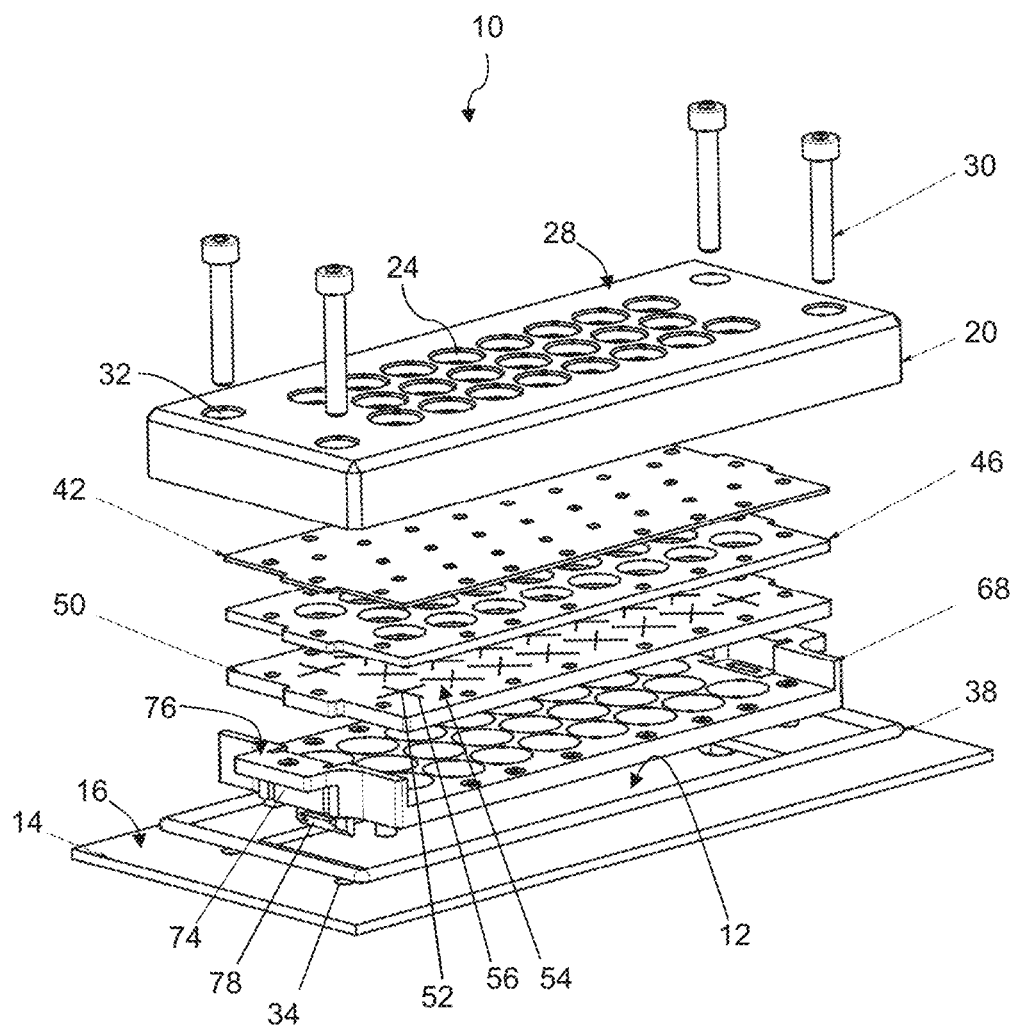
FIG. 3 shows a perspective exploded view of the strand leadthrough device according to FIG. 1.
Figure 4:
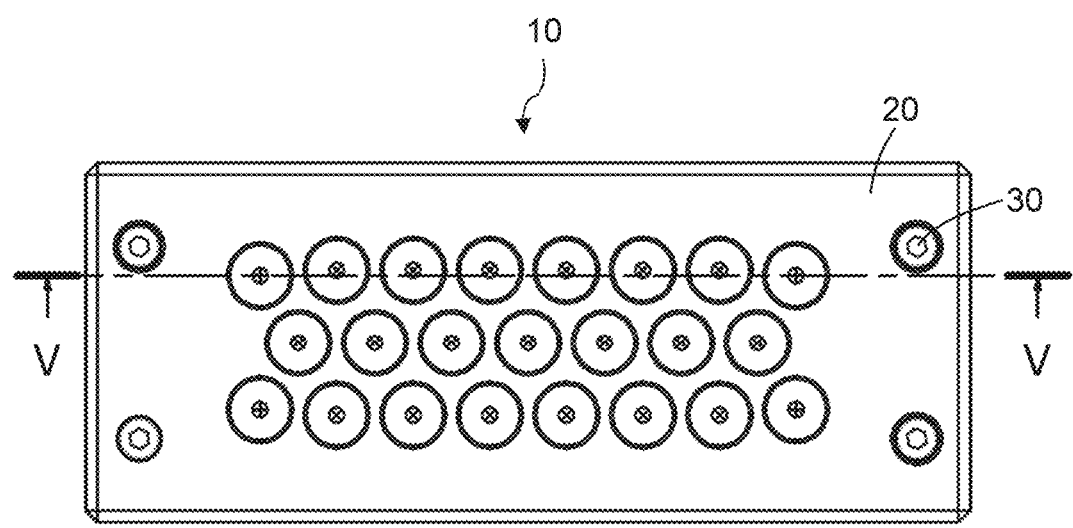
FIG. 4 shows a top view of the strand leadthrough device according to FIG. 1.

In order to seal off the frame 20 in a mounted state from the outer side 16 of the wall 14, the frame 20 in the region of an edge surface 36, which is intended for contact against the outer side 16 of the wall 14, has a sealing apparatus 38 in the form of an O ring encircling the circumference of the frame 20 (compare FIG. 3 and FIG. 5). In order to receive the O ring, the frame 20 in the region of the edge surface 36 has a groove 40 which is closed circumferentially and surrounds all of the clearances 24 of the frame 20.

The leadthrough device 10 furthermore has a first sealing membrane 42 which is arranged in the interior 22 of the frame 20 adjacent to the rear side 28 of the frame 20

(compare FIG. 3 and FIG. 5). The first sealing membrane 42 is in the form of a substantially rectangular flat body (flat material layer) and extends parallel to the rear side 28 of the frame.

Figure 7:
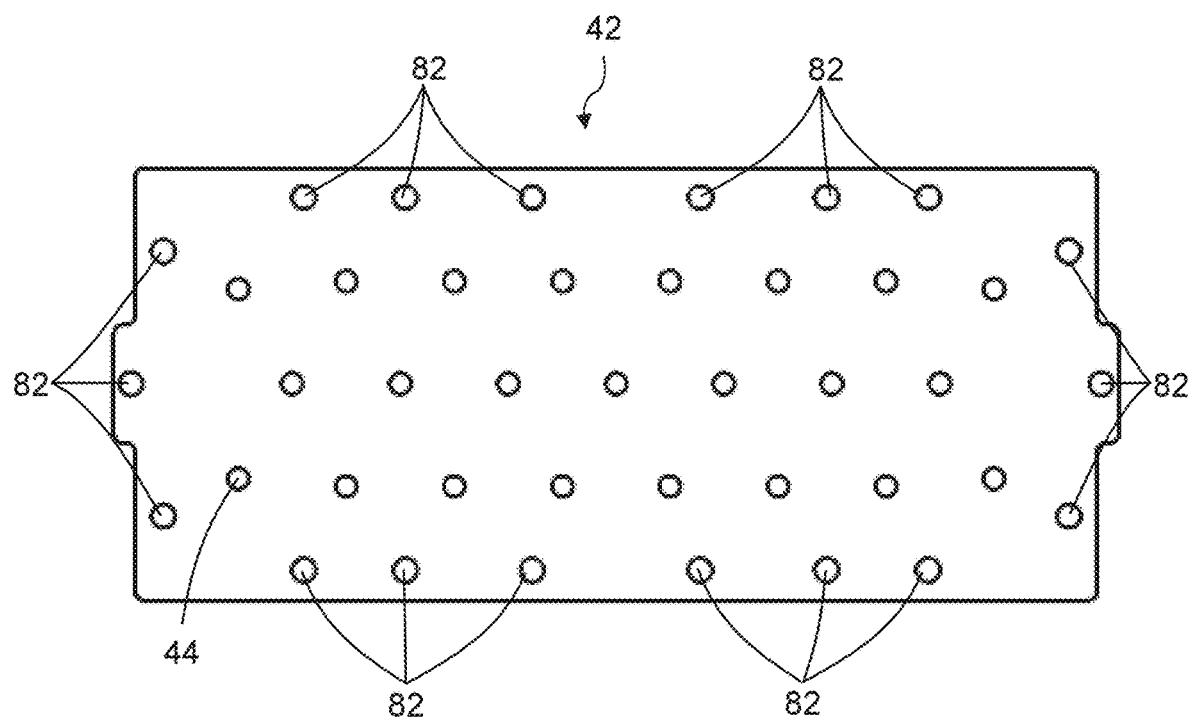
FIG. 7 shows a top view of a first sealing membrane of the strand leadthrough device according to FIG. 1.

The first sealing membrane 42 has a number of circular leadthrough openings 44, corresponding to the number of clearances 24 of the frame 20, through which a strand is led through (compare FIG. 7). The leadthrough openings 44 preferably have a smaller diameter than the clearances 24 of the frame 20 (compare FIG. 5). In particular, the diameter of the leadthrough openings 44 is smaller than the diameter of a thinnest strand 11 to be led through.

When a strand 11 is led through the first sealing membrane 42, the corresponding leadthrough opening 44 is widened elastically and is placed as a result with its edge in a sealing manner against the strand (not illustrated in the figures). By this means, a strand 11 which has been led through is sealed and at the same time is also relieved of tension.

The first sealing membrane 42 is produced from a rubberized fabric.

The first sealing membrane 42 is adhesively bonded to the rear side 28 of the frame 20 by means of an adhesive connection. For this purpose, the first sealing membrane 42 has an adhesive layer on its side facing the rear side 28 of the frame 20.

The strand leadthrough device 10 furthermore has a stabilizing layer 46 which is arranged on that side of the first sealing membrane 42 which faces away from the rear side 28 of the frame 20 in the interior 22 of the frame 20. The stabilizing layer 46 is in the form of a substantially rectangular flat body (flat material layer) and extends parallel to the first sealing membrane 42 (compare FIG. 3).

Figure 8:
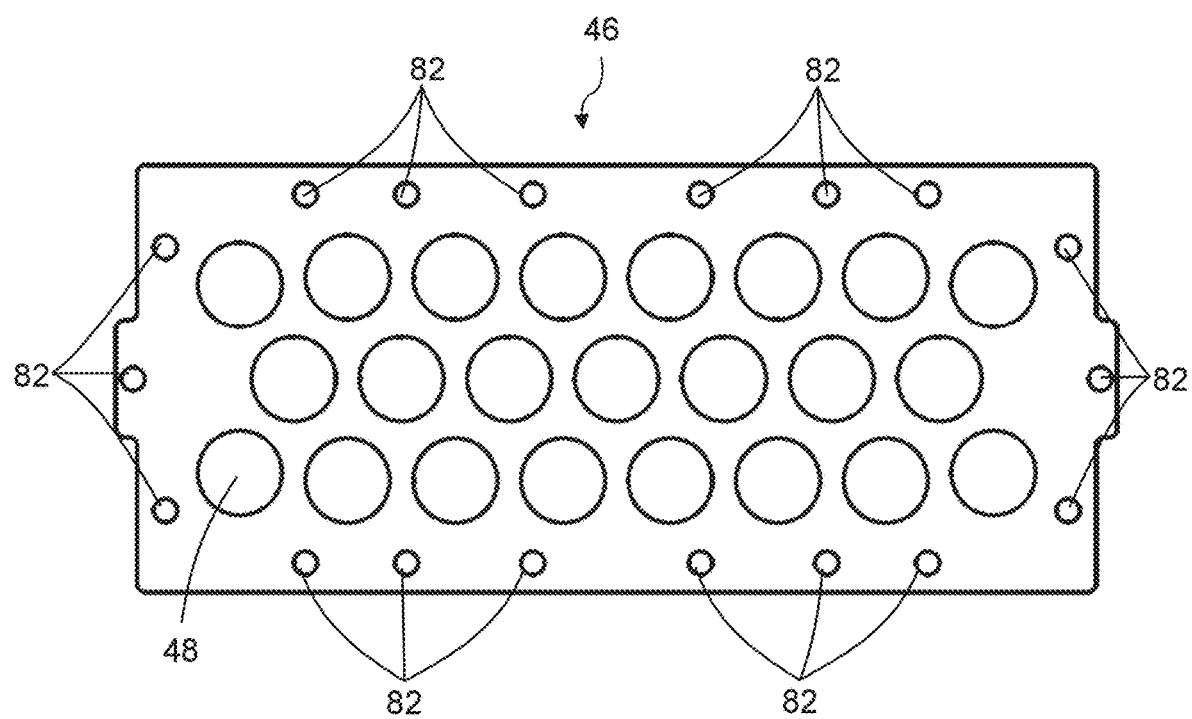
FIG. 8 shows a top view of a stabilizing layer of the strand leadthrough device according to FIG. 1.

The stabilizing layer 46 has a number of circular passage openings 48, corresponding to the number of clearances 24 of the frame 20, through which a strand 11 is led (compare FIG. 8). The passage openings 48 preferably have a diameter corresponding to the diameter of the clearances 24 of the frame 20 (compare FIG. 5). The stabilizing layer 46 is manufactured from a thermoplastic material, for example a polyamide.

Furthermore, the strand leadthrough device 10 has a second sealing membrane 50 which is likewise in the form of a substantially rectangular flat body (flat material layer). The second sealing membrane 50 extends parallel to the first sealing membrane 42 and to the stabilizing layer 46 and is arranged on that side of the stabilizing layer 46 which faces away from the first sealing membrane 42 in the interior 22 of the frame 20 (compare FIG. 3 and FIG. 5). The second sealing membrane 50 is thus spaced apart from the first sealing membrane 42 by means of the stabilizing layer 46.

The second sealing membrane 50 is produced from an elastomer, in particular from a polyurethane gel.

Figure 9:
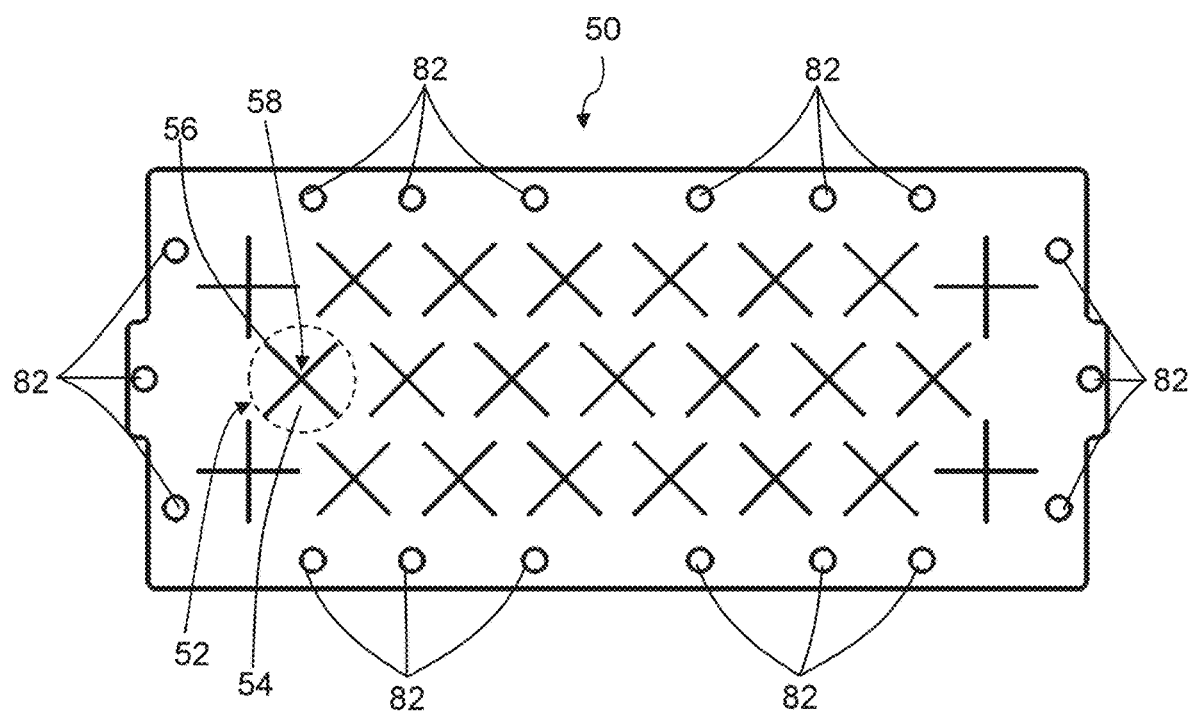
FIG. 9 shows a top view of a second sealing membrane of the strand leadthrough device according to FIG. 1.

The second sealing membrane 50 has a number of leadthrough points 52, corresponding to the number of clearances 24 of the frame 20, through which a strand is led through (compare FIG. 9). In FIG. 9, an individual leadthrough point 52 is emphasized with reference to a circular dashed line. Such a leadthrough point 52 is illustrated in enlarged form in FIG. 10a.

In the region of a respective leadthrough point 52, the second sealing membrane has elastically deformable sealing lamellae 54 which are formed integrally with the second sealing membrane 50. The sealing lamellae 54 of a leadthrough point 52 are bounded by slots 56 which are formed in the second sealing membrane 50 and cut through the second sealing membrane 50 through its entire thickness (compare FIG. 10b). The slots 56 each run radially outward from the center point 58 of a respective leadthrough point 52 as far as an outer end (emphasized by dashed lines in FIGS. 10a to e).

In the exemplary embodiment illustrated, four sealing lamellae 54a, 54b, 54c and 54d are provided per leadthrough point 52, said sealing lamellae being formed by four slots 56 of identical length which are each offset at an angle of 90° from one another (compare FIG. 10a). The sealing lamellae 54 merge at their end which is spaced apart from the center point 58 of a leadthrough point 52 (i.e. in the region of the dashed line shown in FIGS. 9 and 10a-e) into the material 60 of the second sealing membrane 50, the material surrounding the leadthrough point 52, and taper toward their free end (i.e. toward the center point 58 of the leadthrough point 52).

FIGS. 9, 10a and 10b illustrate the second sealing membrane 50 in a starting state without a strand 11 led therethrough. In the starting state, all of the sealing lamellae 54a-d lie in a sealing manner against one another with their respectively mutually facing lateral wall portions (boundary surfaces of the slots 56). For example, the wall portion 62a of the sealing lamella 54a lies in a sealing manner against that wall portion 62b of the sealing lamella 54b that faces it (compare FIG. 10a). In the starting state, preferably all of the leadthrough points 52 of the second sealing membrane 50 are closed. In a mounted starting state of the strand leadthrough device 10, a passage 12 in a wall 14 is accordingly sealed by the second sealing membrane 50.

Figure 10C:
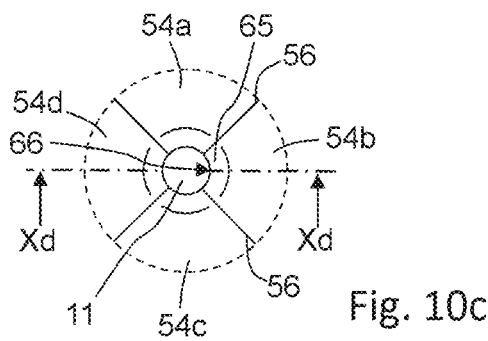
FIG. 10c shows an enlarged detail of a region of a leadthrough point according to FIG. 9, in a use state with a strand led therethrough.
Figure 10D:
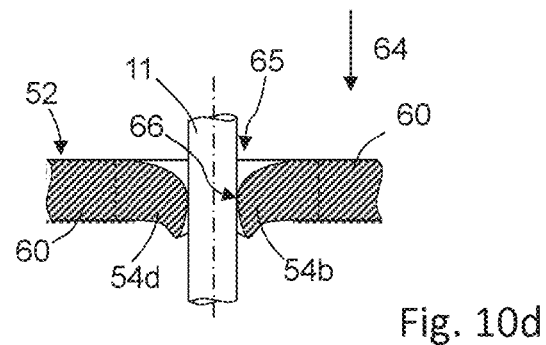
FIG. 10d shows a sectional illustration of the region of a leadthrough point of the second sealing membrane according to FIG. 10c along the section plane Xd-Xd shown in FIG. 10c.

FIGS. 10c and 10d show the region of a leadthrough point 52 in a use state with a strand 11 led therethrough. When the strand 11 is led through a leadthrough point 52 along a leadthrough direction 64, which is oriented perpendicular to the front side 26 of the frame 20, the sealing lamellae 54 are deflected. For this purpose, in the region of the center point 58 and by means of a free end 63 of the strand 11, a compressive force is exerted on those surfaces of the sealing lamellae 54 which face the free end 63, and therefore the sealing lamellae are deflected and deformed corresponding to the leadthrough direction 64; as a result of their deformation, they thus open up an opening through which the strand 11 is led (compare FIGS. 10b and 10d).

In the region of their free ends facing the center point 58 (contact region 65), the sealing lamellae 54 are elastically deformed by the strand 11 led therethrough and, because of the elastic restoring force of their material, lie in a sealing manner against the strand 11 with a sealing surface 66 being formed (emphasized in FIGS. 10c and 10d by way of example for the sealing lamella 54b). Each sealing lamella 54 of a leadthrough point 52 with its respective sealing surface 66 seals a partial portion of the strand 11 with respect to the circumference thereof. The angle limiting the respective partial portion of the circumference of the strand corresponds here to the angle between two slots 56 in each case bounding a sealing lamella 54 (in FIG. 10c, a total of four partial portions with an angular range of 90° in each case are illustrated).

Figure 10E:
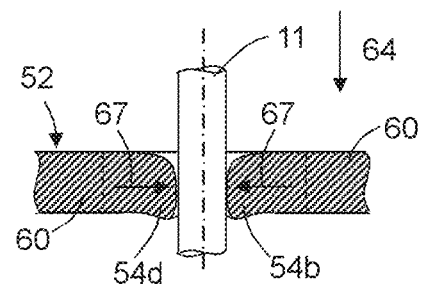
FIG. 10e shows a sectional illustration of the region of a leadthrough point of the second sealing membrane according to FIG. 10d after the strand has slightly been pulled back counter to the leadthrough direction.

In addition to sealing, the second sealing membrane 50 brings about relieving of tension of the strand 11. FIG. 10e shows a state in which the strand 11 has been pulled back for a short distance counter to the leadthrough direction 64 in comparison to the state shown in FIG. 10d. When the strand 11 is pulled back counter to the leadthrough direction 64, the sealing lamellae 54 are moved in the direction of their starting state, illustrated in FIG. 10b, because of the static friction acting between the edge of the sealing lamellae 54 and the lateral surface of the strand 11. Since, in contrast to the starting state which is illustrated in FIG. 10b without a strand led therethrough, the strand 11 is now located in the region of the center point 58 of the leadthrough point 52, the sealing lamellae 54 are elastically deformed in the radial direction (counter to the respective direction of the arrow 67 illustrated in FIG. 10e). As a result of this, the sealing lamellae 54 exert a compressive force on the strand 11 (in the direction of the arrow 67 illustrated in FIG. 10e), which brings about an increased static friction between the sealing lamellae 54 and the strand 11—and therefore tension relief of the strand. Said static friction is increased in particular in the case of strands 11 in the form of cables having an insulating lateral surface produced from a plastics material.

For the removal of a strand 11, the strand 11 can either be pulled out of the leadthrough point 52 counter to the leadthrough direction 64, in which case the tension relief action brought about by the sealing lamellae 54 has to be overcome. It is also possible to guide the strand 11 further in the leadthrough direction 64 through the leadthrough point 52. After a strand 11 which has been previously led through a leadthrough point 52 is removed, the elastic restoring force of the material of the second sealing membrane 50 brings about a deformation of the sealing lamellae 54 back into their starting state which is shown in FIGS. 9, 10a and 10b and in which the sealing lamellae 54 lie against one another closing the leadthrough point 52.

Figure 11A:
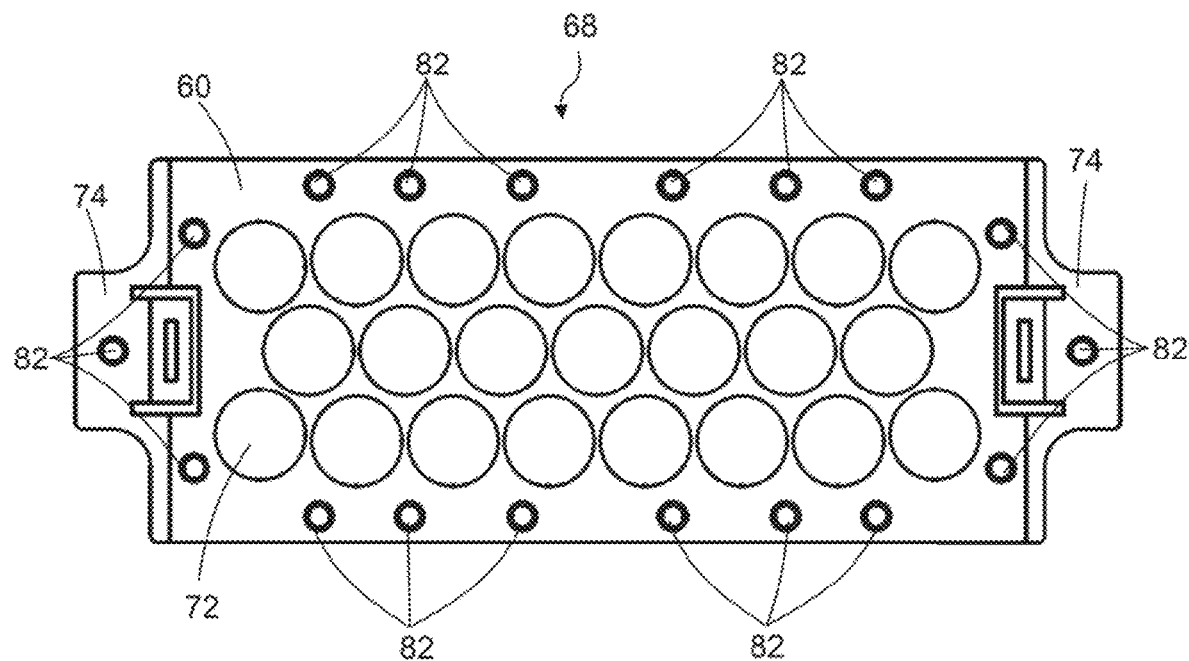
FIG. 11a shows a top view of a stabilizing frame of the strand leadthrough device according to FIG. 1.

The strand leadthrough device 10 furthermore has a stabilizing frame 68 (compare FIG. 3 and FIG. 11a). The stabilizing frame 68 extends with a substantially rectangular, planar main body 70 parallel to the second sealing membrane 50 and is arranged on that side of the second sealing membrane 50 which faces away from the stabilizing layer 46. The stabilizing frame 68 has, in the region of its main body 70, a number of circular frame openings 72 corresponding to the number of clearances 24 of the frame 20 and through which a strand is led. The diameter of the frame openings 72 corresponds, with a tolerance range of 20%, to the sum of the maximum diameter of a strand 11 to be led through and twice the thickness of the second sealing membrane 50.

Figure 11B:
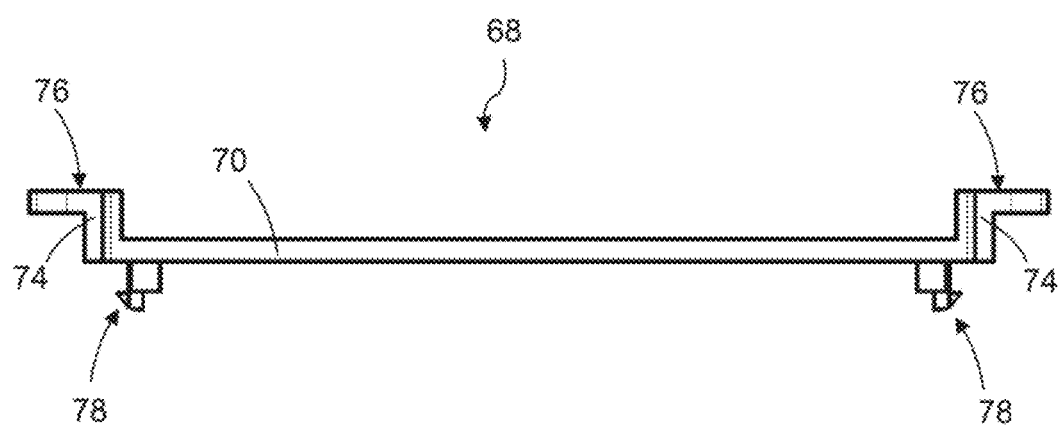

The stabilizing frame 68 furthermore has two contact portions 74 which are arranged on two opposite sides of the main body 70 and are formed integrally with the main body 70 (compare FIG. 11b). The contact portions 74 each have a contact surface 76, which is oriented parallel to the main body 70 and is spaced apart therefrom, for contact with the rear side 28 of the frame 20. In a mounted state, in which the contact surfaces 76 are in contact with the rear side 28 of the frame, the stabilizing frame 68 by means of its contact portions 74 surrounds the first sealing membrane 42, the stabilizing layer 46 and the second sealing membrane 50 on two opposite sides (compare FIG. 5).

Furthermore, the stabilizing frame 68, on its side facing away from the second sealing membrane 50, has latching portions 78 which are preferably arranged on two opposite edge regions of the main body 70 (compare FIG. 11b). In a mounted state of the strand leadthrough device 10, the latching portions 78 latch with the inner side 18 of the wall 14 (compare FIG. 2) for fixing the stabilizing frame 68 on the wall 14. It is possible for the strand leadthrough device 10 to be fastened to the wall 14 only via the latching portions 78 of the stabilizing frame 68. It is also possible that fastening by means of the latching portions 78 takes place in addition to the fastening of the strand leadthrough device 10 by means of the fastening screws 30.

In order to fasten the first sealing membrane 42, the stabilizing layer 46, the second sealing membrane 50 and the stabilizing frame 68 to the frame 20, the frame 20 has pins 80 which protrude from its rear side 28 and pass through the interior 22 (compare FIG. 6a and FIG. 6b). The pins 80 may differ in length and may also protrude beyond the interior 22 of the frame 20 (compare FIG. 6b). In a mounted state of the strand leadthrough device 10, the pins 80 are inserted into corresponding receiving holes 82 in the aforementioned components (preferably in a clamping manner).

In each case one clearance 24 of the frame 20, one leadthrough opening 44 of the first sealing membrane 42, one passage opening 48 in the stabilizing layer 46, one feed-through point 52 of the second sealing membrane 50 and one frame opening 72 in the stabilizing frame 68 are assigned to one another and form a leadthrough channel 84 through which a strand 11 is led. The center points of the clearances 24, leadthrough openings 44, passage openings 48, leadthrough points 52 and frame openings 72, which in each case form a leadthrough channel 84, lie on an imaginary axis oriented perpendicular to the outer side 16 of the wall 14; a leadthrough channel 84 thus extends perpendicular to the outer side 16 of the wall 14.

Figure 12:
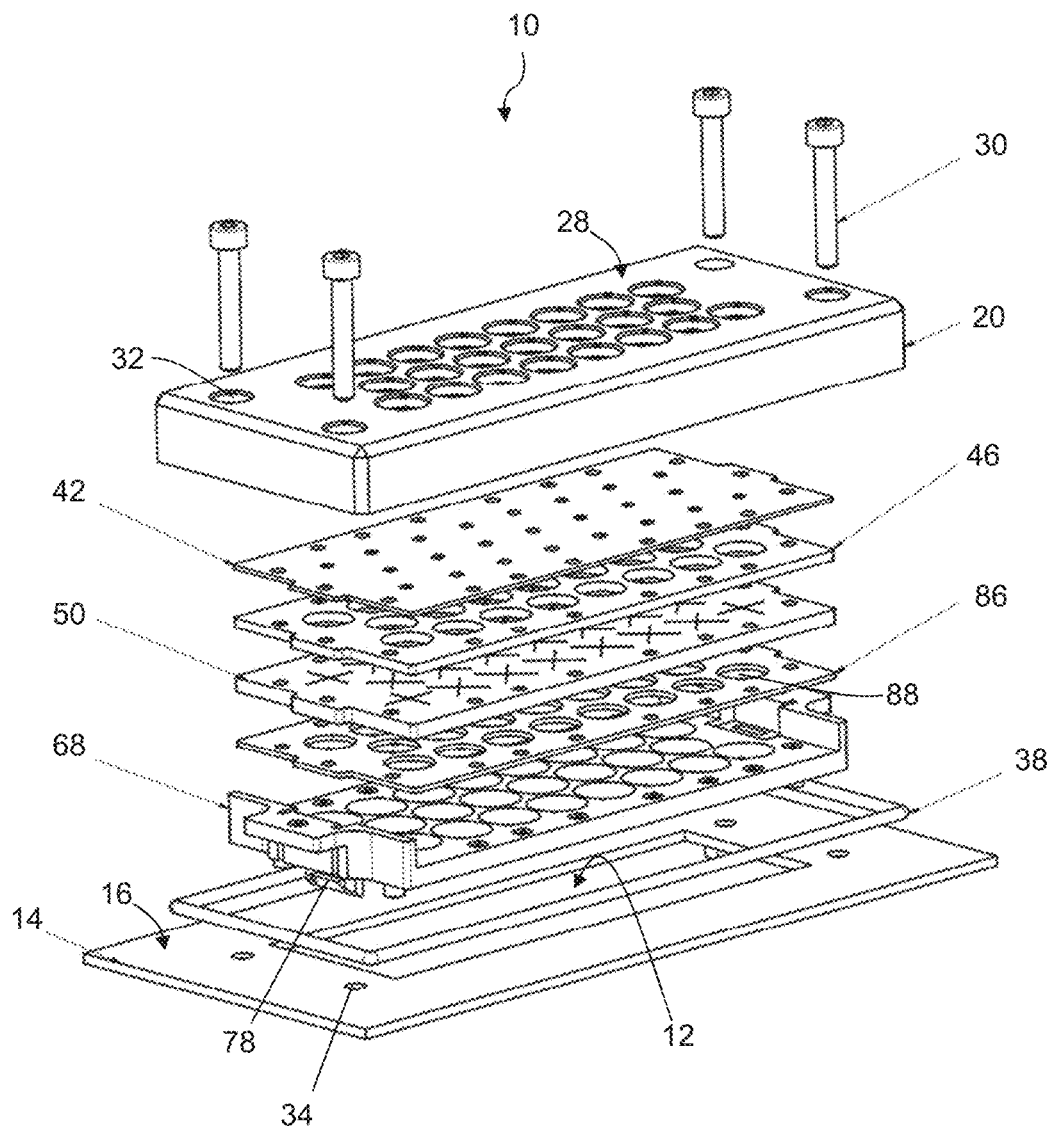
FIG. 12 shows a perspective exploded illustration of a further embodiment of a strand leadthrough device with a fire protection layer.

FIG. 12 shows a further embodiment of a strand leadthrough device 10. The embodiment according to FIG. 12 has common features in respect of its design and its functioning with respect to the strand leadthrough device 10 according to FIG. 3; reference is therefore made to the description above. Only the differences over the strand leadthrough device 10 according to FIG. 3 will be described below. The strand leadthrough device 10 according to FIG. 12 has an additional fire protection layer 86.

The fire protection layer 86 extends parallel to the second sealing membrane 50 and is arranged in the interior 22 of the frame 20 between the second sealing membrane 50 and the stabilizing frame 68. The fire protection layer 86 has a number of circular holes 88 corresponding to the number of clearances 24 in the frame 20 and through which a strand is led. The holes 88 are arranged concentrically with respect to the clearances 24 of the frame 20 and each form part of a leadthrough channel 84.

The fire protection layer 86 is composed of an intumescent material which swells under the action of heat and, in the event of a fire, thus closes the leadthrough channels 84 and therefore the passage 12 in the wall 14.

Figure 13:
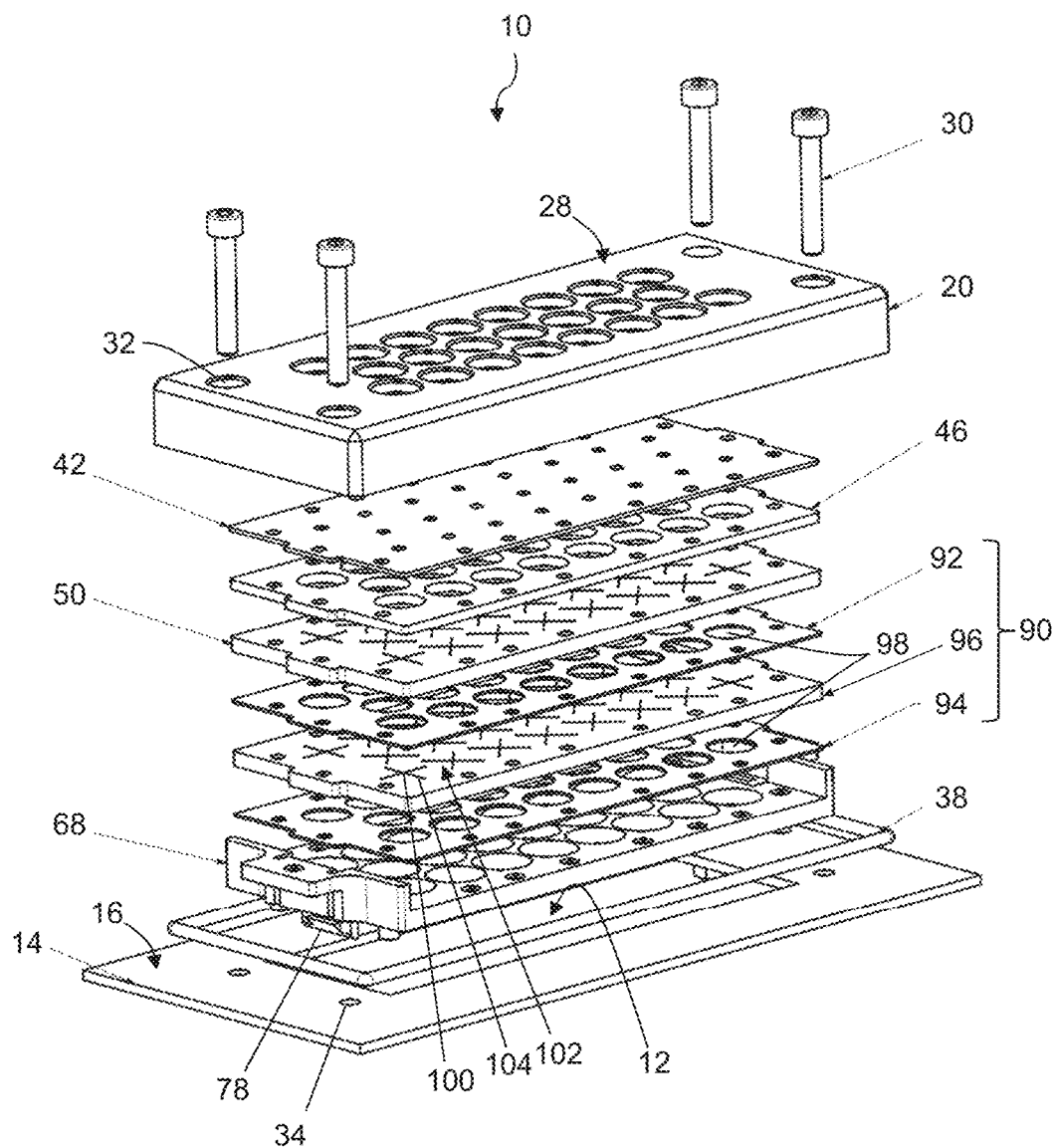
FIG. 13 shows a perspective exploded illustration of a further embodiment of a strand leadthrough device with a shielding apparatus.

FIG. 13 shows a further embodiment of a strand leadthrough device 10. The embodiment according to FIG. 13 has common features in respect of its design and its functioning with respect to the strand leadthrough device 10 according to FIG. 3; reference is therefore made to the description above. Only the differences over the strand leadthrough device 10 according to FIG. 3 will be described below. The strand leadthrough device 10 according to FIG. 13 has an additional shielding apparatus 90 for ensuring the electromagnetic compatibility.

The shielding apparatus 90 comprises a first contact plate 92 and a second contact plate 94 which extends parallel to the second sealing membrane 50. The shielding apparatus 90 furthermore comprises a contact layer 96 which is arranged between the first contact plate 92 and the second contact plate 94 and is connected in an electrically conductive manner thereto. The assembly comprising the first contact plate 92, the contact layer 96 and the second contact plate 94 is arranged in the interior 22 of the frame 20 between the second sealing membrane 50 and the stabilizing frame 68.

The first contact plate 92 and the second contact plate 94 are manufactured from a thin metal sheet and each have a number of circular cutouts 98 corresponding to the number of clearances 24 of the frame 20 and through which a strand 11 is led.

The contact layer 96 is produced from an electrically conductive elastomer material, for example an electrically conductive rubber, and serves for the electrical contact connection of a strand 11 led therethrough, in particular a cable shield. The contact layer 96 has a number of lead-through regions 100 corresponding to the number of clearances 24 of the frame 20 and through which a strand 11 is led.

In the region of the leadthrough regions 100, the contact layer 96 has elastically deformable contact lamellae 102 which, similarly to the above-described sealing lamellae 54 of the second sealing membrane 50, are formed by slots 104 in the contact layer 96. The shape of the contact lamellae 102 substantially corresponds to the above-described shape of the sealing lamellae 54 of the second sealing membrane 50.

The cutouts 98 of the first contact plate 92 and of the second contact plate 94 and the leadthrough regions 100 of the contact layer 96 are arranged concentrically with respect to the clearances 24 of the frame 20 and each form part of a leadthrough channel 84.

FIG. 13 shows a starting state of the strand leadthrough device 10 without a strand led therethrough. In this state, the contact lamellae 102 lie with their mutually facing lateral wall portions (boundary surfaces of the slots 104) against one another in a sealing manner such that the leadthrough regions 100 are closed.

When a strand 11 in the form of a cable or a cable strand is led through, the contact lamellae 102, similarly to the sealing lamellae 54 of the second sealing membrane 50, are deflected corresponding to the leadthrough direction and open up an opening through which the cable is led. Owing to the elastic restoring force of the material, the contact lamellae 102 lie against the cable which has been led through or against the shield of a cable previously freed from the insulation, with an electrical contact being formed. Via the contact plates which are connected in an electrically conductive manner to the contact layer 96, an electrical contact with the surroundings of the strand leadthrough device 10, for example with the wall 14, is then produced. In addition, similarly to the sealing lamellae 54 of the second sealing membrane 50, a sealing action and tension relief of the cable are obtained.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A strand leadthrough device for leading a plurality of strands in the form of cables or cable bundles, pipes, and/or tubes through a passage in a wall, comprising:
   a frame which is fastenable to an outer side of the wall and encloses at least one clearance through which the strands are led;
   a first sealing membrane which has a plurality of leadthrough openings through which a strand is led; and
   a second sealing membrane having a plurality of leadthrough points through which a strand is led,
   wherein, in order to form a leadthrough channel for a strand, in each case one leadthrough point of the second sealing membrane is assigned in each case to one leadthrough opening in the first sealing membrane, and
   wherein, in a region of the leadthrough points, the second sealing membrane has elastically deformable sealing lamellae which, in a starting state, lie against one another closing the leadthrough channel and, in a deformed use state, lie against a strand which is led through the leadthrough channel.

2. The strand leadthrough device as claimed in claim 1, wherein the sealing lamellae are bounded by slots in the second sealing membrane.

3. The strand leadthrough device as claimed in claim 1, wherein the sealing lamellae are identical in size and/or are arranged distributed regularly, as seen in a circumferential direction.

4. The strand leadthrough device as claimed in claim 1, wherein the second sealing membrane is comprised of an elastomer.

5. The strand leadthrough device as claimed in claim 1, wherein the second sealing membrane has a minimum thickness of 2 mm and/or a maximum thickness of 5 mm.

6. The strand leadthrough device as claimed in claim 1, wherein the first sealing membrane is comprised of a rubberized fabric.

7. The strand leadthrough device as claimed in claim 1, wherein the first sealing membrane is connected in an integrally bonded manner to the frame.

8. The strand leadthrough device as claimed in claim 1, wherein center points of the leadthrough openings of the first sealing membrane, which leadthrough openings are in each case assigned to one another in order to form a leadthrough channel for a strand, and center points of the leadthrough points of the second sealing membrane are arranged on an imaginary axis oriented perpendicular to the outer side of the wall.

9. The strand leadthrough device as claimed in claim 1, further comprising a stabilizing layer is provided arranged between first sealing membrane and second sealing membrane and which has a plurality of passage openings through which a strand is led.

10. The strand leadthrough device as claimed in claim 9, further comprising a stabilizing frame arranged on a side of the second sealing membrane which faces away from the stabilizing layer, and which has a plurality of frame openings.

11. The strand leadthrough device as claimed in claim 10, wherein a diameter of the frame openings of the stabilizing frame is equal to 0.8 to 1.2 times a sum of a maximum diameter of a strand to be led through and twice a thickness of the second sealing membrane.

12. The strand leadthrough device as claimed in claim 10, wherein the stabilizing frame has latching portions configured to contact in a latching manner against an inner side of the wall.

13. The strand leadthrough device as claimed in claim 1, further comprising at least one fire protection layer.

14. The strand leadthrough device as claimed in claim 1, further comprising a shielding apparatus.

15. The strand leadthrough device as claimed in claim 2, wherein the slots, which are assigned to a respective leadthrough point, run radially outward from a center point of the respective leadthrough point.

16. The strand leadthrough device as claimed in claim 4, wherein the elastomer comprises a polyurethane gel.

17. The strand leadthrough device as claimed in claim 7, wherein the first sealing membrane is connected in an integrally bonded manner to the frame by an adhesive connection.

18. The strand leadthrough device as claimed in claim 9, wherein the plurality of passage openings corresponds to a number of leadthrough openings of the first sealing membrane.

19. The strand leadthrough device as claimed in claim 10, wherein the plurality of frame openings corresponds to a number of leadthrough openings of the first sealing membrane.

20. A strand leadthrough device for leading a plurality of strands in the form of cables or cable bundles, pipes, and/or tubes through a passage in a wall, comprising:
- a frame which is fastenable to an outer side of the wall and encloses at least one clearance through which the strands are led;
- a first sealing membrane which has a plurality of leadthrough openings through which a strand is led;
- a second sealing membrane having a plurality of leadthrough points through which a strand is led; and
- a shielding apparatus,
- wherein, in order to form a leadthrough channel for a strand, in each case one leadthrough point of the second sealing membrane is assigned in each case to one leadthrough opening in the first sealing membrane,
- wherein, in a region of the leadthrough points, the second sealing membrane has elastically deformable sealing lamellae which, in a starting state, lie against one another closing the leadthrough channel and, in a deformed use state, lie against a strand which is led through the leadthrough channel,
- wherein the shielding apparatus comprises a first contact plate, a second contact plate, and a contact layer arranged between first and second contact plate,
- wherein the contact layer has a plurality of leadthrough regions through which a strand is led, and
- wherein, in a region of the leadthrough regions, the contact layer has elastically deformable compact lamellae.

* * * * *